United States Patent [19]

Akiyama

[11] 4,004,241
[45] Jan. 18, 1977

[54] HYBRID FEEDBACK AMPLIFIER OF A PUSH-PULL TYPE

[75] Inventor: Susumu Akiyama, Tokyo, Japan

[73] Assignee: Nippon Electric Company, Ltd., Tokyo, Japan

[22] Filed: July 23, 1975

[21] Appl. No.: 598,470

[30] Foreign Application Priority Data

July 25, 1974 Japan ............................. 49-85312

[52] U.S. Cl. .................................. 330/15; 330/28; 330/30 R; 330/82; 330/84

[51] Int. Cl.² ...................... H03F 3/26; H03F 1/34

[58] Field of Search ................. 330/15, 81, 82, 84, 330/118, 28, 30 R

[56] References Cited

UNITED STATES PATENTS

| | | | |
|---|---|---|---|
| 2,763,732 | 9/1956 | Rockwell | 330/81 X |
| 3,566,236 | 2/1971 | Johnson | 330/118 X |

FOREIGN PATENTS OR APPLICATIONS

| | | | |
|---|---|---|---|
| 1,285,012 | 12/1968 | Germany | 330/15 |

Primary Examiner—James B. Mullins
Attorney, Agent, or Firm—Sughrue, Rothwell, Mion, Zinn & Macpeak

[57] ABSTRACT

A feedback amplifier including a first and a second amplifier section comprises an autotransformer winding connected between common terminals of the respective amplifier sections and across a feedback circuit. A terminating impedance is connected between the output terminal of one of the amplifier sections and the autotransformer winding at a point nearer to its point of connection to the other amplifier section common terminal. Another terminating impedance is connected between the other amplifier section output terminal and the autotransformer winding at another point nearer to its point of connection to the common terminal of the above-mentioned one amplifier section. The terminating impedances may be used on the input side. They may be connected to the autotransformer winding at its points of connection to the respective common terminals, when the autotransformer may be dispensed with.

27 Claims, 10 Drawing Figures

HYBRID FEEDBACK AMPLIFIER OF A PUSH-PULL TYPE

BACKGROUND OF THE INVENTION

This invention relates to hybrid feedback amplifier of a push-pull type. The amplifier is specifically adapted for use in a line repeater for a carrier telephone transmission system, such as a 12-MHz or a 60-MHz coaxial transmission system, or in a repeater for a CATV system.

The important requisites to such an amplifier are (1) a small distortion factor for avoiding nonliner cross talk, (2) a sufficient gain for precisely and stably equalizing the transmission line loss, and (3) an input and/or output impedance matched to the line impedance for obviating reflection of signals. The distortion factor mentioned above as the requisite (1) may be reduced by negative feedback techniques and by adoption of a push-pull construction which cancels the second-order distortion dominant in the distorted components. The negative feedback techniques in general are described by Hendrik W. Bode in a book entitled "Network Analysis and Feedback Amplifier Design" and published in 1954 by D. van Nostrand Company, Inc. It is also stated in the referenced book, at pages 35–39, that hybrid feedback is excellent for simultaneously satisfying the above-mentioned requisites (2) and (3).

It is usual on resorting to the hybrid feedback techniques to use a transformer as a hybrid coil. This, however, is in contradiction to rendering an amplifier broad-banded particularly at higher frequencies. In order to overcome the defect, it has been proposed in U.S. Pat. Nos. 3,487,325 and 3,820,036 to use an autotransformer as the hybrid coil. In order to make a push-pull amplifier fully achieve the cancellation of distortion, it is a well-known important requisite to make the circuitry completely symetric so as to avoid unbalance in the stray capacitance, the leakage inductance, and the like. While attempts have been made to provide a wide-band high-frequency amplifier of a small distortion factor by combination of known techniques, mere adoption of the hybrid feedback to a push-pull amplifier inevitably results in complicated circuitry.

SUMMARY OF THE INVENTION

It is therefore an object of the present invention to provide a push-pull type hybrid feedback amplifier of simple construction.

It is another object of this invention to provide a hybrid feedback amplifier of a push-pull type, wherein hybrid feedback is applied to at least one of its input and output circuits by the use of simple circuitry so as to make the hybrid feedback and the push-pull structure achieve both small distortion and wide-band amplification.

In accordance with this invention, a hybrid feedback amplifier of a push-pull type comprises a first and a second signal input terminal, a first and a second signal output terminal, and a first and a second amplifier section of substantially same characteristics, each having a first, a second, and a common terminal. One end of a first terminating impedance is connected to a feedback circuit at a first point of connection while the other end is connected to the first amplifier section second terminal. One end of a second terminating impedance, substantially equal to the first terminating impedance, is connected to the feedback circuit at a second point of connection while the other end is connected to the second amplifier section second terminal. First means, which may be a first portion of an autotransformer winding, connects the first amplifier section common terminal to the second point of connection. Second means of substantially same characteristics as the first means connects the second amplifier section common terminal to the first point of connection. When use is made of the autotransformer winding portion as the first means, the autotransformer winding should have a symmetrically disposed second portion for use as the second means. Third means connects one of the first signal input and output terminals to the first amplifier section first terminal and to the feedback circuit. Fourth means of substantially same characteristics as the third means connects corresponding one of the second signal input and output terminals to the second amplifier section first terminal and to the feedback circuit. Fifth means connects the other of the first signal input and output terminals to the first amplifier section second terminal. Sixth means of substantially same characteristics as the fifth means connects the other of the second signal input and output terminals to the second amplifier section second terminal, so that the feedback circuit now feeds a fraction of signals delivered from the signal input terminals to the signal output terminals through the amplifier section back to the signal input terminals. When the third and fourth means connect the signal input terminals to the amplifier section first terminals, the fifth and sixth means connect the signal output terminals to the amplifier section second terminals to make the first and second terminals serve as the input and output terminals of the amplifier sections. Each of the first through sixth means may be a mere conductor. On the other hand, each of the third and fourth means may comprise an additional amplifier section and terminating impedance.

BRIEF DESCRIPTION OF THE DRAWING

8A illustrates a corresponding portion of the feedback amplifier according to a seventh embodiment of this invention.

Figure 1:
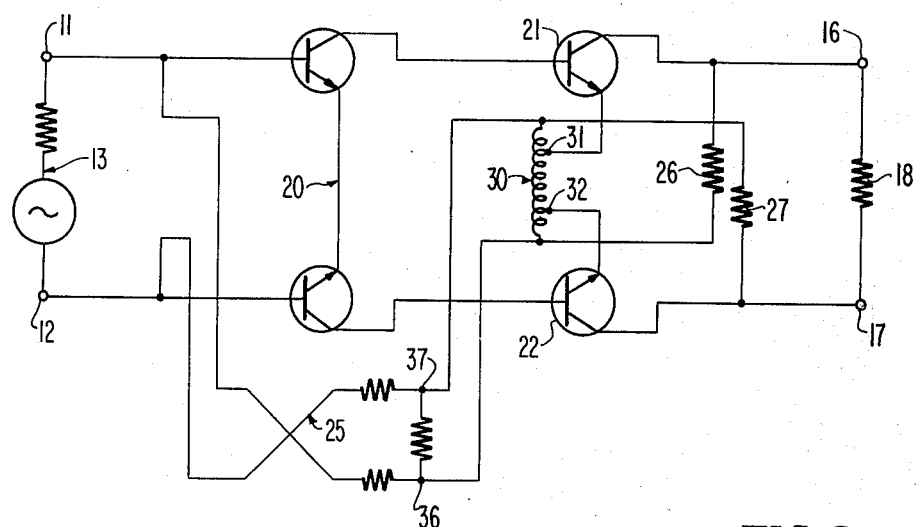
FIG. 1 shows the circuit of a push-pull type hybrid feedback amplifier according to a first embodiment of the instant invention.

DESCRIPTION OF THE PREFERRED EMBODIMENTS:

Referring to FIG. 1, a push-pull type hybrid feedback amplifier according to a first embodiment of the present invention comprises a first and a second signal input terminal 11 and 12 for connection across a signal source 13, a first and a second signal output terminal 16 and 17 for connection across a load 18, a balanced amplifier circuit 20, a first amplifier section 21 of another amplifier circuit having an input and an output terminal, and a second amplifier section 22 of the other amplifier circuit having an input and an output terminal. As depicted, the balanced amplifier circuit 20 may comprise a pair of transistors as the active circuit elements. The first and second amplifier sections 21 and 22 are of substantially same characteristics, each having a "common" terminal. When these amplifier sections 21 and 22 comprise a pair of transistors connected in common-emitter configuration, the common terminals as called herein are the emitter terminals. In accordance with the first embodiment, the first and second signal input terminals 11 and 12 are connected by plain conductors to the input terminals of the respective amplifier sections 21 and 22 through the balanced amplifier curcuit 20. Likewise, the first and second signal output terminals 16 and 17 are connected by simple conductors directly to the output terminals of the respective amplifier sections 21 and 22. Under the circumstances, the balanced amplifier circuit 20 and the other amplifier circuit comprising the amplifier sections 21 and 22 serve as the first-stage and second-stage amplifier circuits. In the first embodiment, a feedback circuit or network 25 has a pair of input-side terminals connected to the signal input terminals 11 and 12 by mere conductors, a first output-side terminal connected to the first signal output terminal 16 through a first terminating impedance 26, and a second output-side terminal connected to the second signal output terminal 17 through a second terminating impedance 27 which is substantially equal to the first terminating impedance 26. An autotransformer winding 30 has a first intermediate terminal 31 connected to the common terminal of the first amplifier section 21, a symmetrically arranged second intermediate terminal 32 connected to the second amplifier section common terminal, a first end terminal disposed in a predetermined relation to the first intermediate terminal 31, and a second end terminal situated in the predetermined relation to the second intermediate terminal 32. The second end terminal is connected to a first point of connection 36 or the first terminating impedance 26 to the feedback circuit 25. The first end terminal is connected to a second point of connection 37 of the second terminating impedance 27 to the feedback circuit 25. In other words, a first portion between the first intermediate and end terminals of the autotransformer winding 30 connects the first amplifier section common terminal to the second point of connection 37. A second portion between the second intermediate and end terminals of the autotransformer winding 30 connects the second amplifier section common terminal to the first point of connection 36. The feedback network 25 may comprise three equal resistors connected as shown. As will readily be understood, the amplifier sections 21 and 22 operate in a push-pull fashion with cooperation of the terminating impedances 26 and 27 and the autotransformer winding 30. That fraction of the amplified signals delivered to the signal output terminals 16 and 17 which appears across the autotransformer winding 30 between the end terminals is fed by the feedback network 25 to the signal input terminals 11 and 12 with reversed polarity.

In operation, let the voltage applied by the signal source 13 across the signal input terminals 11 and 12 be denoted by $V_1$, the voltage delivered to the signal output terminals 16 and 17 be denoted by $V_2$, the substantially equal input voltage of each amplifier section 21 and 22 be denoted by $V_5$, the substantially equal output voltage of the amplifier section 21 or 22 be denoted by $V_6$, and the voltage supplied across the output-side terminals of the feedback network 25 be denoted by $V_7$. Let the current flowing through a closed circuit comprising the signal source 13 and the input side of the balanced amplifier circuit 20 be denoted by $I_1$, the current flowing through another closed circuit comprising the load 18, the terminating impedances 26 and 27, and the autotransformer winding 30 be denoted by $I_2$, the current flowing through a still another closed circuit comprising the output side of the balanced amplifier circuit 20, the input sides of the respective amplifier sections 21 and 22, and the autotransformer winding 30 by denoted by $I_5$, the current flowing through yet another closed circuit comprising the load 18, the output side of the amplifier sections 21 and 22, and the autotransformer winding 30 be denoted by $I_6$, the current flowing through a further closed circuit comprising the output-side terminals of the feedback network 25 and the autotransformer winding 30 be denoted by $I_7$, and the current flowing through a still further closed circuit comprising the input-side terminals of the feedback network 25 and the input side of the balanced amplifier cirucit 20 be denoted by $I_8$. Furthermore, let the Z parameters of each amplifier section 21 or 22, the balanced amplifier circuit 20, and the feedback network 25 be $Z^{(1)}$, $Z^{(2)}$, and $Z^{(\beta)}$, the turn ratio of the autotransformer winding portions between the end terminals and between the intermediate terminals be $n$, and each terminating impedance by $R$. Then, the voltages $V_1$, $V_2$, and $V_5$ through $V_7$ and the currents $I_5$ through $I_7$ are given as functions of the currents $I_1$ and $I_2$ by a matrix equation:

$$\begin{bmatrix} 1 & 0 & 0 & 0 & 0 & -Z_{12}^{(2)} & 0 & 0 & Z_{11}^{(2)} \\ 0 & 0 & 2 & 0 & 1/n & -Z_{22}^{(2)} & 0 & 0 & Z_{21}^{(2)} \\ 0 & 0 & 1 & 0 & 0 & -Z_{11}^{(1)} & -Z_{12}^{(1)} & 0 & 0 \\ 0 & 0 & 0 & 1 & 0 & -Z_{21}^{(1)} & -Z_{22}^{(1)} & 0 & 0 \\ 0 & 0 & 0 & 0 & 1 & 0 & 0 & -Z_{11}^{(\beta)} & -Z_{12}^{(\beta)} \\ 1 & 0 & 0 & 0 & 0 & 0 & 0 & -Z_{21}^{(\beta)} & -Z_{22}^{(\beta)} \\ 0 & 1 & 0 & -2 & -1/n & 0 & 0 & 0 & 0 \\ 0 & 1 & 0 & 0 & 1 & 0 & 2R & 0 & 0 \\ 0 & 0 & 0 & 0 & 0 & 1 & (n+1) & -n & 0 \end{bmatrix} \times \begin{bmatrix} V_1 \\ V_2 \\ V_5 \\ V_6 \\ V_7 \\ I_5 \\ I_6 \\ I_7 \\ I_8 \end{bmatrix}$$

-continued $$= \begin{bmatrix} Z_{11}^{(2)} & 0 \\ Z_{21}^{(2)} & 0 \\ 0 & 0 \\ 0 & 0 \\ 0 & 0 \\ 0 & 0 \\ 0 & 0 \\ 0 & 2R \\ 0 & 2R \end{bmatrix} \times \begin{bmatrix} I_1 \\ I_2 \end{bmatrix}. \quad (1)$$

In order to calculate input and output impedances $Z_i$ and $Z_o$ of the feedback amplifier and loss K in the feedback amplifier output circuit, let the voltages $V_1$, $V_2$, and $V_6$ and the current $I_6$ be calculated as:

$$\begin{bmatrix} V_1 \\ V_2 \\ V_6 \\ I_6 \end{bmatrix} = \begin{bmatrix} Z_{11}^{(f)} & Z_{12}^{(f)} \\ Z_{21}^{(f)} & Z_{22}^{(f)} \\ Z_{61}^{(f)} & Z_{62}^{(f)} \\ A_{61}^{(f)} & A_{62}^{(f)} \end{bmatrix} \times \begin{bmatrix} I_1 \\ I_2 \end{bmatrix} \quad (2)$$

from Equation (1). Inasmuch as the amplifier circuits 21, 22, and 20 are active circuits, the parameters $Z_{21}^{(1)}$ and $Z_{21}(2)$ must be sufficiently greater than other parameters. The coefficients $Z_{11}^{(f)}$ and so on in Equation (2) are therefore given by:

$$Z_{11}^{(f)} \approx 0, \quad (3)$$

$$Z_{12}(f) \approx 0, \quad (4)$$

$$Z_{21}^{(f)} \approx [\Delta Z^{(\beta)} - 2nRZ_{22}^{(\beta)}/(n+1)]/Z_{21}^{(\beta)}, \quad (5)$$

$$Z_{22}^{(f)} \approx 2R/(n+1), \quad (6)$$

$$Z_{61}^{(f)} \approx [(n+1)\Delta Z^{(\beta)}/n - 2nRZ_{22}^{(\beta)}/(n+1)]/(2Z_{21}^{(\beta)}), \quad (7)$$

$$Z_{62}^{(f)} \approx R/(n+1), \quad (8)$$

$$A_{61}^{(f)} \approx -nR_{22}^{(\beta)}/[(n+1)Z_{21}^{(\beta)}], \quad (9)$$

and $$A_{62}^{(f)} = n/(n+1), \quad (10)$$

where
$\Delta Z^{(\beta)} = Z_{11}^{(\beta)}Z_{22}^{(\beta)} - Z_{12}^{(\beta)}Z_{21}^{(\beta)}$.

On the other hand, known network theory teaches that the input and output impedances $Z_i$ and $Z_o$ of the feedback amplifier to which the signal source 13 and load 18 of impedances $Z_G$ and $Z_L$ are connected are given by:

$$Z_i = Z_{11}^{(f)} - Z_{12}^{(f)}Z_{21}^{(F)}/(R_L + Z_{22}^{(f)}) \quad (11)$$

and $$Z_o = Z_{22}^{(f)} - Z_{12}^{(f)}Z_{21}^{(f)}/(R_G + Z_{11}^{(f)}) \quad (12)$$

when use is made of the coefficients used in Equation (2). By putting Equations (3) through (6) into Equations (11) and (12), $$Z_i = 0 \quad (13)$$

and $$Z_o = 2R/(n+1) \quad (14)$$

result. Equation (13) shows that the input impedance $Z_i$ is always equal to zero. Equation (14) shows that the output impedance $Z_o$ is not dependent on the circuit constants of the feedback network 25 and the impedance of the signal source 13 but is a function of only the autotransformer turn ratio $n$ and the terminating impedance R. It follows therefore that selection of an impedance:

$$R = (n+1)R_L/2 \quad (15)$$

for each of the terminating impedances 26 and 27 enables the output impedance $Z_o$ to be equal to, namely, matched to the load impedance $R_L$. The output circuit loss K, which is defined by a ratio of the last-stage amplifier output power to the load power, is now given by:

$$K = 2V_6I_6/(R_LI_2^2) \quad (16)$$

because the output power of each amplifier section 21 or 22 is $V_6I_6$. Let the electromotive force of the signal source 13 be designated by $2E_1$. Now, $$V_1 = 2E_1 - R_GI_1 \quad (17)$$

and $$V_2 = -R_LI_2 \quad (18)$$

follow. By substituting Equations (17) and (18) into Equation (2), it is possible to give the variables $V_6$, $I_6$, and $I_2$ in Equation (16) in terms of $E_1$. By gain substituting thus-calculated variables $V_6$, $I_6$, and $I_2$ into Equation (16), $$K = 2[R_L + Z_{22}^{(f)})Z_{61}^{(f)}/(R_L + Z_{21}^{(f)}) - Z_{62}^{(f)}/R_L] \times [A_{62}^{(f)} - A_{61}^{(f)}(Z_{22}^{(f)} + R_L)/Z_{21}^{(f)}] \quad (19)$$

results. When the output impedance $Z_o$ of the feedback amplifier is matched to the load impedance $R_L$, $$K = [(n+1)/n] \left[ 1 - \left( 1 - \frac{2\Delta Z(\beta)/(nR_L Z_{22}(\beta))}{1 + \Delta Z(\beta)/(nR_L Z_{22}(\beta))} \right)^2 /(n+1)^2 \right] \quad (20)$$

is obtained by substitution of Equations (3) through (10) and (15) into Equation (19). From Equation (20), it is understood that:

$$K \leq (n+1)/n$$

always holds for the output circuit loss K. If $n \geq 1$, the loss K is never greater than two, namely, 3 dB. If $n = 4$, the loss K is equal to 5/4, namely, smaller than 1 dB.

Figure 2:
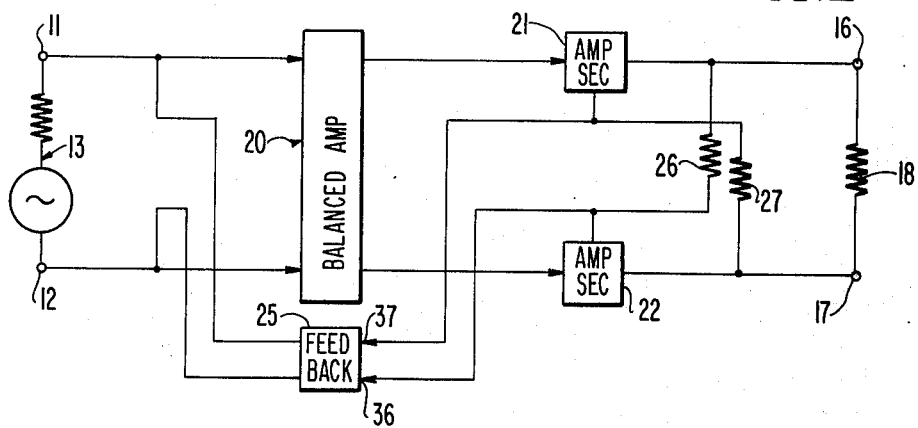
FIG. 2 shows the circuit of a push-pull type hybrid feedback amplifier according to a second embodiment of this invention.

Referring to FIG. 2, a push-pull type hybrid feedback amplifier according to a second embodiment of this invention comprises, instead of the autotransformer winding 30 and its associated elements, a pair of simple conductors connecting the common terminal of the first amplifier section 21 to the second point of connection 37 and the common terminal of the second amplifier section 22 to the first point of connection 36, respectively. This embodiment may be derived by rendering the turn ratio $n$ equal to unity, namely, by reducing the lengths of the above-mentioned first and second autotransformer winding portions to zero, when the autotransformer winding 30 serves merely as a choke coil and may be dispensed with. Inasmuch as $n = 1$ irrespective of presence or absence of the autotransformer winding 30, Equation (20) becomes:

$$K = 2 \left[ 1 - \left( 1 - \frac{2\Delta Z(\beta)/(R_L Z_{22}(\beta))}{1 + \Delta Z(\beta)/(R_L Z_{22}(\beta))} \right)^2 /4 \right],$$

with the result that the output circuit loss K is never greater than two, namely, 3 dB. According to this embodiment, a very broad-band hybrid feedback amplifier of a push-pull type is obtained because absence of the autotransformer winding 30 exempts the band restriction which would otherwise be imposed both on the lower and higher frequencies.

Figure 3:
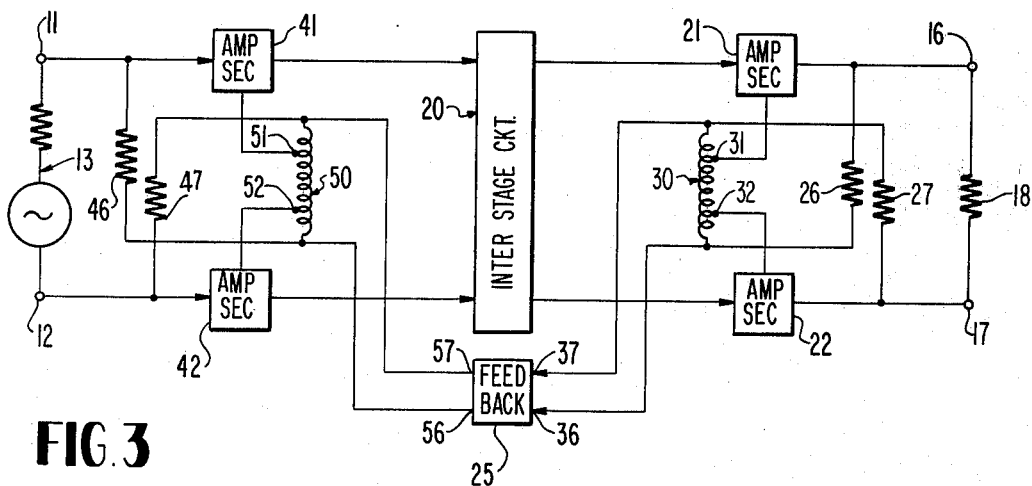
FIG. 3 shows the circuit of a push-pull type hybrid feedback amplifier according to a third embodiment of this invention.

Referring to FIG. 3, a push-pull type hybrid feedback amplifier according to a third embodiment of this invention comprises a push-pull amplifier circuit also on the input side to which the hybrid feedback is applied. More particularly, the feedback amplifier comprises a third and a fourth amplifier section 41 and 42 of the input-side push-pull amplifier circuit whose input terminals are connected to the first and second signal input terminals 11 and 12 and whose output terminals are connected to a balanced interstage circuit 20 which may no more necessarily be an amplifier circuit. These amplifier sections 41 and 42 are again of substantially same characteristics, each having a common terminal. A third and a fourth terminating impedance 46 and 47 of a substantially equal impedance R' have corresponding ends connected to the signal input terminals 11 and 12. A second autotransformer winding 50 has a first and a second intermediate terminal 51 and 52 between a first and a second end terminal so that the turn ratio of the winding portions between the intermediate terminals and between the end terminals may be $n'$. The other ends of the third and fouth terminating impedances 46 and 47 are connected to the feedback network 25 at a third and a fourth point of connection 56 and 57. The first and second intermediate terminals 51 and 52 of the second autotransformer winding 50 are connected to the common terminals of the third and fourth amplifier sections 41 and 42, while their first and second end terminals are connected to the fourth and third points of connection 57 and 56, respectively.

The analysis discussed in conjunction with the first embodiment similarly applies to the third embodiment. The input impedance $Z_i$ of the feedback amplifier seen from the signal input terminals 11 and 12 and the output impedance $Z_o$ thereof seen from the signal output terminals 16 and 17 are therefore given by:

$$Z_i = 2R'/(n' + 1)$$

and $$Z_o = 2R/(n + 1),$$

with the result that these impedances $Z_i$ and $Z_o$ are matched to the signal source impedance $R_G$ and to the load impedance $R_L$ when each of the third and fourth terminating impedances 46 and 47 and each of the first and second terminating impedances 26 and 27 are given by:

$$R' = (n' + 1)R_G/2$$

$$R = (n + 1)R_L/2.$$

Figure 4:
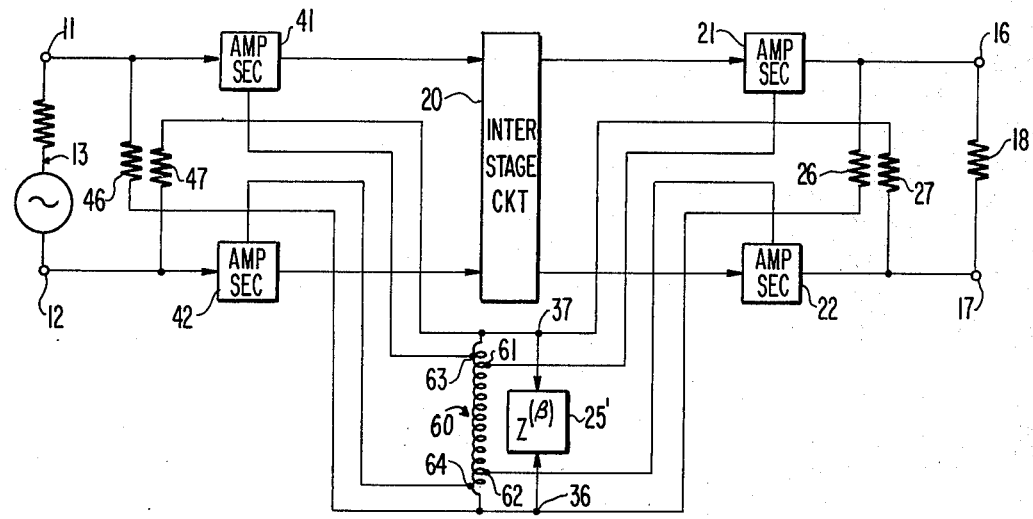
FIG. 4 shows the circuit of a push-pull type hybrid feedback amplifier according to a fourth embodiment of this invention.

Referring to FIG. 4, a push-pull type hybrid feedback amplifier according to a fourth embodiment of this invention comprises, in place of two autotransformer windings 30 and 50 and a feedback network 25 of a two-pair-terminal network, a single autotransformer winding 60 having a first, a second, a third, and a fourth intermediate terminal 61, 62, 63, and 64 and a feedback circuit 25' of a two-terminal impedance. The first and third terminating impedances 26 and 46 are connected to the feedback circuit 25' at a first common point of connection 66. The second and fourth terminating impedances 27 and 47 are connected to the feedback circuit 25' at a second common point of connection 67. A first and a second end terminal of the autotransformer winding 60 are connected to the second and first common points of connection 67 and 66, respectively. A first and a second autotransformer winding portion which lie between the first end and intermediate terminals and between the second end and intermediate terminals connect the common terminals of the first and second amplifier sections 21 and 22 to the second and first common points of connection 67 and 66, respectively. A third and a fourth autotransformer winding portion which extend between the first end and third intermediate terminals and between the second end and fourth intermediate terminals connect the common terminals of the third and fourth amplifier sections 41 and 42 to the second and first common points of connection 67 and 66, respectively.

Figure 5A:
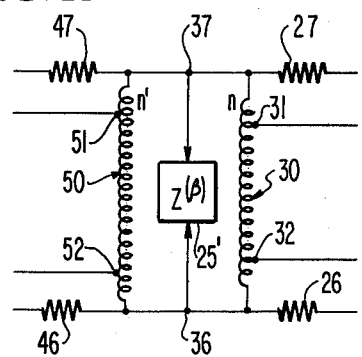
FIG. 5A illustrates a portion of a push-pull type hybrid feedback amplifier according to a modification of the third embodiment
Figure 5B:
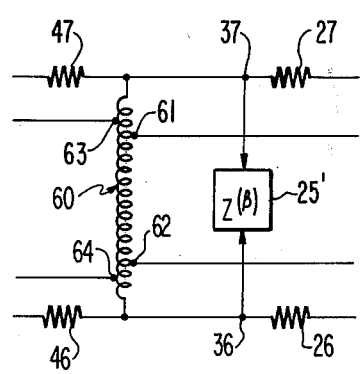
FIG. 5B illustrates a corresponding portion of the feedback amplifier according to the fourth embodiment.

Referring to FIGS. 5A and 5B, a push-pull type hybrid feedback amplifier according to a modification of the third embodiment comprises a two-terminal impedance element 25' of an impedance $Z^{(\beta')}$ in place of the feedback circuit 25 of a two-pair-terminal network depicted in FIG. 1 and used in the feedback amplifier shown in FIG. 3. With this modification, the voltage appearing between the second autotransformer winding end terminals becomes equal to that appearing between the first autotransformer winding end terminals. As a result, the two autotransformer windings 30 and 50 may be unified into a single autotransformer winding 60 illustrated with reference to FIG. 4 and depicted in FIG. 5B for convenience of comparison with FIG. 5A. It will now be appreciated that the operation of the feedback amplifier according to the fourth embodiment is quite similar to that described in conjunction with the feedback amplifier according to the third embodiment.

Figure 6:
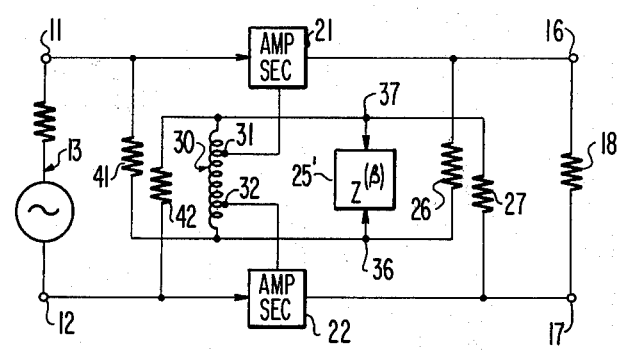
FIG. 6 shows the circuit of a push-pull type hybrid feedback amplifier according to a fifth embodiment of this invention.

Referring to FIG. 6, a push-pull type hybrid feedback amplifier according to a fifth embodiment of this invention comprises a single stage push-pull amplifier circuit comprising, in turn, the first and second amplifier sections 21 and 22. The hybrid feedback is applied both to the output and input sides. In this event, the third terminating impedance 46 is connected between the input terminal of the first amplifier section 21 and the first point of connection 36, while the fourth terminating impedance 47 is connected between the input terminal of the second amplifier section 22 and the second point of connection 37. Operation of this feedback amplifier will readily be understood with reference to the feedback amplifier according to the fourth embodiment by rendering the turn ratios $n$ and $n$ equal and by substituting the single stage amplifier circuit for the interstage circuit 20 and the two-stage amplifier circuits comprising the first through fourth amplifier sections 21, 22, 41, and 42.

Figure 7:
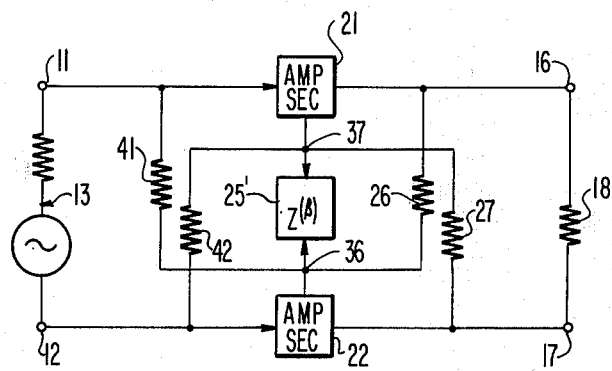
FIG. 7 shows the circuit of a push-pull type hybrid feedback amplifier according to a sixth embodiment of this invention.

Referring finally to FIG. 7, a push-pull type hybrid feedback amplifier according to a sixth embodiment of this invention is quite similar to the feedback amplifier according to the fifth embodiment but for the autotransformer winding 30, which is dispensed with in accordance with the sixth embodiment. Operation of the feedback amplifier according to the sixth embodiment will easily be understood when reference is had to the feedback amplifier illustrated with reference to FIG. 2.

Figure 8A:
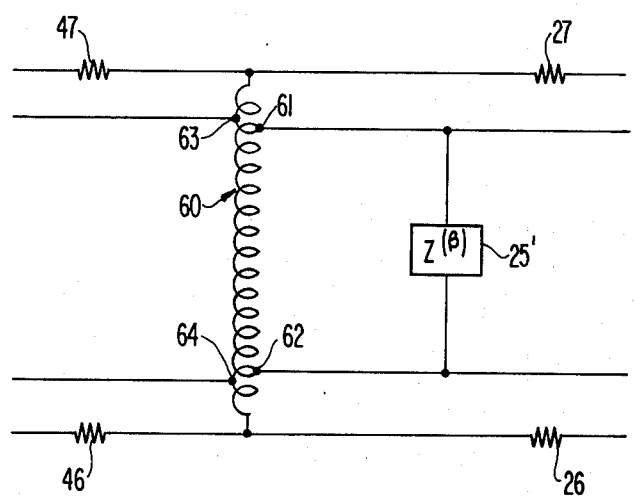
FIG. 8B shows a corresponding portion of the feedback amplifier according to an eighth embodiment.
Figure 8B:
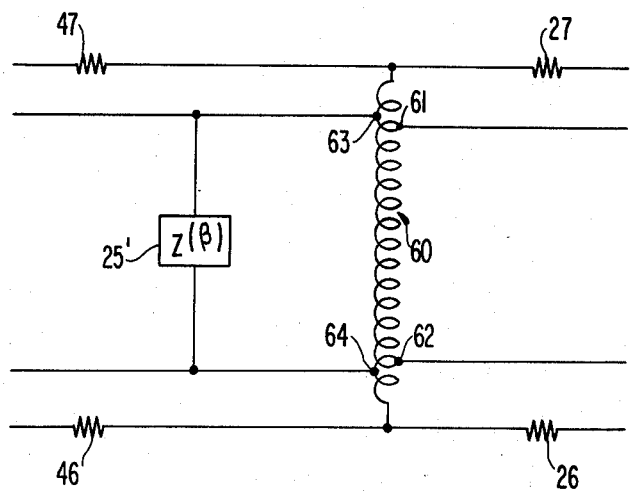

While several embodiments of this invention have thus far been described, it will readily be appreciated by those skilled in the art that other embodiments are possible in accordance with the teaching set forth in this specification and claims. For instance, the hybrid feedback may be applied only to the input side throughout the embodiments already described. The autotransformer windings 30 and 50 shown in FIG. 3 may be dispensed with. In FIGS. 4 and 5A, the single autotransformer winding 60 may also be dispensed with. The impedance element 25' may be connected either between the first and second intermediate terminals 61 and 62 as shown in FIG. 8A or between the third and fourth intermediate terminals 63 and 64 as shown in FIG. 8B. The feedback circuit may then be deemed to comprise either the autotransformer winding portions between the first end and intermediate terminals and between the second end and intermediate terminals or the autotransformer winding portions between the first end and third intermediate terminals and between the second end and fourth intermediate terminals. This is also the case with the fifth embodiment illustrated with reference to FIG. 6. The autotransformer winding 30, 50, or 60 may extend beyond the points of connection to the first and second points of connection 36 and 37 or beyond the points of connection to the third and fourth points of connection 56 and 57. The "end" terminals as called herein should therefore be understood to be the end terminals of the effective part of the autotransformer winding. The feedback circuit 25 or 25' may consist of a pair of plain conductors, with the feedback impedance $Z^{(\beta')}$ rendered infinite. The plain or similar conductor as named herein may be a shielded wire or a like conductor.

What is claimed is:

1. A feedback amplifier comprising a first and a second signal input terminal; a first and a second signal output terminal; a first and a second amplifier section of substantially same characteristics, each amplifier section having a first, a second, and a common terminal; a feedback circuit; a first terminating impedance having two ends, one end being connected to said feedback circuit at a first point of connection, the other end being connected to said first amplifier section second terminal; a second terminating impedance having two ends, one end of said second terminating impedance being connected to said feedback circuit at a second point of connection, the other end of said second terminating impedance being connected to said second amplifier section second terminal, said second terminating impedance being substantially equal to said first terminating impedance; first means connecting said first amplifier section common terminal to said second point of connection; second means connecting said second amplifier section common terminal to said first point of connection; third means connecting one of said first signal input and output terminals to said first amplifier section first terminal and to said feedback circuit; fourth means connecting a corresponding one of said second signal input and output terminals to said second amplifier section first terminal and to said feedback circuit; fifth means connecting the other of said first input and output terminals to said first amplifier section second terminal; and sixth means connecting the other of said second signal input and output terminals to said second amplifier section second terminal; said feedback circuit feeding a fraction of signals delivered from said first and second signal input terminals to said first and second signal output terminals through said amplifier sections back to said first and second signal input terminals with reversed polarity; said second, fourth, and sixth means having substantially same characteristics as said first, third, and fifth means, respectively.

2. A feedback amplifier as claimed in claim 1, wherein said first and second amplifier sections comprise a pair of transistors, respectively, each having a base electrode, a collector electrode, and an emitter electrode, the base electrodes being connected to ones of said first and second terminals that are connected to said signal input terminals through said third and fourth means or said fifth and sixth means, the collector electrodes being connected to the others of said first and second terminals, the emitter electrodes being connected to said common terminals.

3. A feedback amplifier as claimed in claim 1, wherein said first means comprises a first portion of an autotransformer winding having a first and a second end terminals connected to said second and first points of connection, respectively, a first intermediate terminal connected to said first amplifier section common terminal, and a second intermediate terminal disposed substantially symmetrically with respect to said first intermediate terminal and connected to said second amplifier section common terminal, said first portion extending between said first end and intermediate terminals; and said second means comprises a second portion of said autotransformer winding that extends between said second end and intermediate terminals.

4. A feedback amplifier as claimed in claim 3, wherein a turn ratio of a first number of turns of the autotransformer winding between said end terminals to a second number of turns of the autotransformer winding between said intermediate terminals is not smaller than unity.

5. A feedback amplifier as claimed in claim 4, wherein said fifth and sixth means consist of a pair of plain conductors, respectively, connecting said others of said signal input and output terminals to said amplifier section second terminals and an impedance R of each of said terminating impedances is given by:

$$R = (n + 1)Z/2,$$

where $n$ represents said turn ratio and $Z$ represents an impedance of a circuit across which said others of said signal input and output terminals are to be connected.

6. A feedback amplifier as claimed in claim 5, wherein said third and fourth means comprise a balanced amplifier circuit connected between said ones of said signal input and output terminals and said amplifier section first terminals and further comprise a pair of plain conductors, respectively, connecting said ones of said signal input and output terminals to said feedback circuit.

7. A feedback amplifier as claimed in claim 1, wherein said first means consists of a plain conductor connecting said first amplifier section common terminal to said second point of connection and said second means consists of another plain conductor connecting said second amplifier section common terminal to said first point of connection.

8. A feedback amplifier as claimed in claim 7, wherein said fifth and sixth means consist of a pair of plain conductors, respectively, connecting said others of said signal input and output terminals to said first and second amplifier section second terminals and an impedance of each of said first and second terminating impedances is substantially equal to an impedance of a circuit across which said others of said signal input and output terminals are to be connected.

9. A feedback amplifier as claimed in claim 8, wherein said third and fourth means comprise a balanced amplifier circuit connected between said ones of said signal input and output terminals and said first and second amplifier section first terminals and further comprise a pair of plain conductors, respectively, connecting said ones of said signal input and output terminals to said feedback circuit.

10. A feedback amplifier comprising a first and a second signal input terminal; a first and a second signal output terminal; a first and a second amplifier section of substantially same characteristics, each having a first, a second, and a common terminal; a feedback circuit; a first terminating impedance having two ends, one end being connected to said feedback circuit at a first point of connection, the other end being connected to said first amplifier section second terminal; a second terminating impedance having two ends, one end of said second terminating impedance being connected to said feedback circuit at a second point of connection, the other end of said second terminating impedance being connected to said second amplifier section second terminal, said second terminating impedance being substantially equal to said first terminating impedance; first means connecting said first amplifier section common terminal to said second point of connection; second means connecting said second amplifier section common terminal to said first point of connection; third means connecting one of said first signal input and output terminals to said first amplifier section first terminal and to said feedback circuit; fourth means connecting corresponding one of said second signal input and output terminals to said second amplifier section first terminal and to said feedback circuit; fifth means connecting the other of said first input and output terminals to said first amplifier section second terminal; sixth means connecting the other of said second signal input and output terminals to said second amplifier section second terminal; said feedback circuit feeding a fraction of signals delivered from said signal input terminals to said signal output terminals through said amplifier sections back to said signal input terminals with reversed polarity; said second, fourth, and sixth means having substantially same characteristics as said first, third and fifth means respectively; said first means comprising a first portion of an autotransformer winding having a first and a second end terminals connected to said second and first points of connection, respectively, a first intermediate terminal connected to said first amplifier section common terminal, and a second intermediate terminal disposed substantially symmetrically with respect to said first intermediate terminal and connected to said second amplifier section common terminal, said first portion extending between said first end and intermediate terminals; said second means comprising a second portion of said autotransformer winding that extends between said second end and intermediate terminals; a turn ratio of a first number of turns of the autotransformer winding between said end terminals to a second number of turns of the autotransformer winding between said intermediate terminals is not smaller than unity; said fifth and sixth means comprising a pair of plain conductors, respectively, connecting said others of said signal input and output terminals to said amplifier section second terminals and an impedance R of each of said terminating impedances is given by:

$$R = (n + 1)Z/2,$$

where $n$ represents said turn ratio and $Z$ represents an impedance of a circuit across which said others of said signal input and output terminals are to be connected; said third means comprises a third amplifier section having a first, a second, and a common terminal, a plain conductor connecting said one of said first signal input and output terminals to said third amplifier section first terminal, seventh means connecting said third amplifier section second terminal to said first amplifier section first terminal, and a third terminating impedance connecting said one of said first signal input and output terminals to said feedback circuit at a third point of connection; and said forth means comprises a fourth amplifier section having a first, a second, and a common terminal, a plain conductor connecting said one of said second signal input and output terminals to said fourth amplifier section first terminal, eighth means connecting said fourth amplifier section second terminal to said second amplifier section first terminal, and a fourth terminating impedance connecting said one of said second signal input and output terminals to said feedback circuit at a fourth point of connection; said third means further comprising a first portion of a second autotransformer winding having a first and a second end terminal connected to said fourth and third points of connection, respectively, a first intermediate terminal connected to said third amplifier section common terminal, and a second intermediate terminal disposed substantially symmetrically with respect to said second autotransformer winding first intermediate terminal and connected to said fourth amplifier section common terminal, said second autotransformer winding first portion extending between said second autotransformer winding first end and intermediate terminals; said fourth means further comprising a second portion of said second autotransformer winding that extends between said second autotransformer second end and intermediate terminals; said fourth terminating impedance being substantially equal to said third terminating impedance, said fourth amplifier section and said eighth means being of substantially same characteristics as said third amplifier section and said seventh means.

11. A feedback amplifier as claimed in claim 10, wherein a second turn ratio of a third number of turns of the second autotransformer winding between said second autotransformer end terminals to a fourth number of turns of the second autotransformer winding between said second autotransformer intermediate terminals is not smaller than unity.

12. A feedback amplifier as claimed in claim 11, wherein an impedance $R'$ of each of said third and fourth terminating impedances is given by:

$$R' = (n' + 1)Z'/2,$$

where $n'$ represents said second turn ratio and $Z'$ represents an impedance of another circuit across which said ones of said signal input and output terminals are to be connected.

13. A feedback amplifier comprising a first and a second signal input terminal; a first and a second signal output terminal; a first and a second amplifier section of substantially same characteristics, each having a first, a second, and a common terminal; a feedback circuit; a first terminating impedance having two ends, one end being connected to said feedback circuit at a first point of connection, the other end being connected to said first amplifier section second terminal; a second terminating impedance having two ends, one end of said second terminating impedance being connected to said feedback circuit at a second point of connection, the other end of said second terminating impedance being connected to said second amplifier section second terminal, said second terminating impedance being substantially equal to said first terminating impedance; first means connecting said first amplifier section common terminal to said second point of connection; second means connecting said second amplifier section common terminal to said first point of connection; third means connecting one of said first signal input and output terminals to said first amplifier section first terminal and to said feedback circuit; fourth means connecting corresponding one of said second signal input and output terminals to said second amplifier section first terminal and to said feedback circuit; fifth means connecting the other of said first input and output terminals to said first amplifier section second terminal; sixth means connecting the other of said second signal input and output terminals to said second amplifier section second terminal; said feedback circuit feeding a fraction of signals delivered from said signal input terminals to said signal output terminals through said amplifier sections back to said signal input terminals with reversed polarity; said second, fourth, and sixth means having substantially same characteristics as said first, third and fifth means, respectively; said first means comprising a first portion of an autotransformer winding having a first and a second end terminals connected to said second and first points of connection, respectively, a first intermediate terminal connected to said first amplifier section common terminal, and a second intermediate terminal disposed substantially symmetrically with respect to said first intermediate terminal and connected to said second amplifier section common terminal, said first portion extending between said first end and intermediate terminals; and said second means comprising a second portion of said autotransformer winding that extends between said second end and intermediate terminals; a turn ration of a first number of turns of the autotransformer winding between said end terminals to a second number of turns of the autotransformer winding between said intermediate terminals is not smaller than unity; said fifth and sixth means comprising a pair of plain conductors, respectively, connecting said others of said signal input and output terminals to said amplifier section second terminals and an impedance R of each of said terminating impedances is given by:

$$R = (n + 1)Z/2,$$

where $n$ represents said turn ratio and Z represents an impedance of a circuit across which said others of said signal input and output terminals are to be connected; said third means comprises seventh means connecting said one of said first signal input and output terminals to said first amplifier section first terminal and a third terminating impedance connecting said one of said first signal input and output terminals to said first point of connection and said fourth means comprises eighth means connecting said one of said second signal input and output terminals to said second amplifier section first terminal and a fourth terminating impedance connecting said one of said second signal input and output terminals to said second point of connection; said eighth means being of substantially same characteristics as said seventh means, said fourth terminating impedance being substantially equal to said third terminating impedance.

14. A feedback amplifier as claimed in claim 13, wherein said seventh means comprises a third amplifier section having a first, a second, and a common terminal, a plain conductor connecting said one of said first signal input and output terminals to said third amplifier section first terminal, ninth means connecting said third amplifier section second terminal to said first amplifier section first terminal, and a third portion of said autotransformer winding connecting said third amplifier section common terminal to said second point of connection; and said eighth means comprises a fourth amplifier section having a first, a second, and a common terminal, a plain conductor connecting said one of said second signal input and output terminals to said fourth amplifier section first terminal, tenth means connecting said fourth amplifier section second terminal to said second amplifier section first terminal, and a fourth portion of said autotransformer winding connecting said fourth amplifier section common terminal to said first point of connection; said fourth amplifier section, said fourth portion, and said tenth means being of substantially same characteristics as said third amplifier section, said third portion, and said ninth means.

15. A feedback amplifier as claimed in claim 14, wherein a second turn ratio of a third number of turns of the autotransformer winding between said end terminals to a fourth number ot turns of the autotransformer winding between said third and fourth portions is not smaller than unity.

16. A feedback amplifier as claimed in claim 15, wherein an impedance $R'$ of each of said third and fourth terminating impedances is given by:

$$R' = (n' + 1)Z'/2,$$

where $n'$ represents said second turn ratio and $Z'$ represents an impedance of another circuit across which said ones of said signal input and output terminals are to be connected.

17. A feedback amplifier as claimed in claim 16, wherein said feedback circuit consists of an impedance element connected between said first and second points of connection parallel to said autotransformer winding.

18. A feedback amplifier as claimed in claim 16, wherein said feedback circuit comprises said first and second portions of said autotransformer winding and an impedance element connected between said first and second intermediate terminals parallel to the autotransformer winding between said first and second intermediate terminals.

19. A feedback amplifier as claimed in claim 16, wherein said feedback circuit comprises said third and fourth portions of said autotransformer winding and an impedance element connected between a third and a fourth intermediate terminal connected to said third and fourth amplifier section common terminals, parallel to the autotransformer winding between said third and fourth intermediate terminals.

20. A feedback amplifier as claimed in claim 13, wherein said seventh and eighth means consist of a pair of plain conductors, respectively, connecting said ones of said signal input and output terminals to said first and second amplifier section first terminals.

21. A feedback amplifier as claimed in claim 20, wherein an impedance of each of said third and fourth terminating impedances is equal to the impedance of each of said first and second terminating impedances.

22. A feedback amplifier as claimed in claim 21, wherein said feedback circuit consists of an impedance element connected between said first and second points of connection parallel to said autotransformer winding.

23. A feedback amplifier as claimed in claim 21, wherein said feedback circuit comprises said first and second portions of said autotransformer winding and an impedance element connected between said first and second intermediate terminals parallel to the autotransformer winding between said first and second intermediate terminals.

24. A feedback amplifier comprising a first and a second signal input terminal; a first and a second signal output terminal; a first and a second amplifier section of substantially same characteristics, each having a first, a second, and a common terminal; a feedback circuit; a first terminating impedance having two ends, one end being connected to said feedback circuit at a first point of connection, the other end being connected to said first amplifier section second terminal; a second terminating impedance having two ends, one end of said second terminating impedance being connected to said feedback circuit at a second point of connection, the other end of said second terminating impedance being connected to said second amplifier section second terminal, said second terminating impedance being substantially equal to said first terminating impedance; first means connecting said first amplifier section common terminal to said second point of connection; second means connecting said second amplifier section common terminal to said first point of connection; third means connecting one of said first signal input and output terminals to said first amplifier section first terminal and to said feedback circuit; fourth means connecting corresponding one of said second signal input and output terminals to said second amplifier section first terminal and to said feedback circuit; fifth means connecting the other of said first input and output terminals to said first amplifier section second terminal; sixth means connecting the other of said second signal input and output terminals to said second amplifier section second terminal; said feedback circuit feeding a fraction of signals delivered from said signal input terminals to said signal output terminals through said amplifier sections back to said signal input terminals with reversed polarity; said second, fourth, and sixth means having substantially same characteristics as said first, third, and fifth means, respectively; said first means comprises a plain conductor connecting said first amplifier section common terminal to said second point of connection and said second means consists of another plain conductor connecting said second amplifier section common terminal to said first point of connection; said fifth and sixth means comprises a pair of plain conductors, respectively, connecting said others of said signal input and output terminals to said first and second amplifier section second terminals and an impedance of each of said first and second terminating impedances is substantially equal to an impedance of a circuit across which said others of said signal input and output terminals are to be connected; said third means comprises seventh means connecting said one of said first signal input and output terminals to said first amplifier section first terminal and a third terminating impedance connecting said one of said first signal input and output terminals to said first point of connection and said fourth means comprises eighth means connecting said one of said second signal input and output terminals to said second amplifier section first terminal and a fourth terminating impedance connecting said one of said second signal input and output terminals to said second point of connection; said fourth terminating impedance being substantially equal to said third terminating impedance, said eighth means being of substantially same characteristics as said seventh means.

25. A feedback amplifier as claimed in claim 24, wherein an impedance of each of said third and fourth terminating impedances is substantially equal to an impedance of another circuit across which said ones of said signal input and output terminals are to be connected.

26. A feedback amplifier as claimed in claim 25, wherein said seventh means comprises a third amplifier section having a first, a second, and a common terminal, a plain conductor connecting said one of said first signal input and output terminals to said third amplifier section first terminal, ninth means connecting said third amplifier section second terminal to said first amplifier section first terminal, and another plain conductor connecting said third amplifier section common terminal to said second point of connection; and said eighth means comprises a fourth amplifier section having a first, a second, and a common terminal, a plain conductor connecting said one of said second signal input and output terminals to said fourth amplifier section first terminal, tenth means connecting said fourth amplifier section second terminal to said second amplifier section first terminal, and another plain conductor connecting said fourth amplifier section common terminal to said first point of connection; said fourth amplifier section and said tenth means being of substantially same characteristics as said third amplifier section and said ninth means.

27. A feedback amplifier as claimed in claim 25, wherein said seventh and eighth means consist of a pair of plain conductors, respectively, connecting said ones of said signal input and output terminals to said first and second amplifier section first terminals.

* * * * *

UNITED STATES PATENT AND TRADEMARK OFFICE
CERTIFICATE OF CORRECTION

PATENT NO. : 4,004,241
DATED : January 18, 1977
INVENTOR(S) : Susumu AKIYAMA

It is certified that error appears in the above-identified patent and that said Letters Patent are hereby corrected as shown below:

Column 1, line 6 - after "to" insert -- a -- line 13 - delete "nonliner" and insert -- nonlinear -- line 38 - delete "symetric" and insert -- symmetric --

Column 2, line 54 - after "embodiment" insert a semi-colon line 64 - before "8A" insert -- FIG. --

Column 4, line 23 - after "21" delete "and" and insert -- or -- line 47 - delete "cirucit" and insert -- circuit --

Column 5, line 63 - delete "$Z_{21}^{(F)}$" and insert -- $Z_{21}^{(f)}$ --

Column 6, line 63 - after "2[" insert -- ( -- line 63 - delete "$R_L + Z_{21}^{(f)}$" and insert -- $R_L Z_{21}^{(f)}$ --

Column 9, line 32 - delete "n and n" and insert -- n and n' --

Column 12, line 66 - delete "forth" and insert -- fourth --

Column 14, line 28 - delete "ration" and insert -- ratio --

Signed and Sealed this

Twenty-sixth Day of April 1977

[SEAL]

Attest:

RUTH C. MASON
Attesting Officer

C. MARSHALL DANN
Commissioner of Patents and Trademarks